(12) United States Patent
Sanders et al.

(10) Patent No.: US 7,620,136 B2
(45) Date of Patent: Nov. 17, 2009

(54) CLOCK AND DATA RECOVERY CIRCUIT HAVING GAIN CONTROL

(75) Inventors: Anthony Fraser Sanders, Haar (DE); Edoardo Prete, München (DE)

(73) Assignee: Infineon Technologies AG, Neubiberg (DE)

( * ) Notice: Subject to any disclaimer, the term of this patent is extended or adjusted under 35 U.S.C. 154(b) by 543 days.

(21) Appl. No.: 11/346,905

(22) Filed: Feb. 3, 2006

(65) Prior Publication Data

US 2007/0183553 A1  Aug. 9, 2007

(51) Int. Cl.
*H04L 7/00* (2006.01)
(52) U.S. Cl. .................. 375/371; 375/345; 375/375; 327/146; 327/155
(58) Field of Classification Search .......... 375/371, 375/373, 375, 376, 345; 327/146, 147, 150, 327/154, 155, 159, 163
See application file for complete search history.

(56) References Cited

U.S. PATENT DOCUMENTS

| | | | |
|---|---|---|---|
| 5,448,598 A * | 9/1995 | Yousefi et al. .............. 375/376 |
| 6,047,024 A | 4/2000 | How | |
| 6,809,598 B1 * | 10/2004 | Staszewski et al. .......... 331/16 |
| 6,947,514 B1 * | 9/2005 | Kato et al. .................. 375/376 |
| 6,981,168 B2 | 12/2005 | Schmatz et al. | |
| 7,042,260 B2 * | 5/2006 | Choi .......................... 327/156 |
| 7,154,979 B2 * | 12/2006 | Takatori et al. ............. 375/376 |
| 7,272,196 B2 * | 9/2007 | Bonaccio et al. ............ 375/326 |
| 2004/0202261 A1 | 10/2004 | Gregorius | |
| 2004/0202266 A1 | 10/2004 | Gregorius et al. | |
| 2005/0271169 A1 | 12/2005 | Momtaz et al. | |
| 2005/0271173 A1 | 12/2005 | Chou et al. | |

OTHER PUBLICATIONS

Beeson et al. (US 2005/0058235); Mar. 17, 2005; Clock And Data Recovery System For A Wide Range Of Bit Rates.*
Jri Lee et al., "Analysis and Modeling of Bang-Bang Clock and Data Recovery Circuits", *IEEE Journal of Solid-State Circuits*, vol. 39, No. 9, Sep. 2004. pp. 1571-1580.

* cited by examiner

*Primary Examiner*—Dac V Ha
(74) *Attorney, Agent, or Firm*—Dicke, Billig & Czaja, PLLC

(57) ABSTRACT

A clock and data recovery circuit includes a phase detector configured to compare a phase of a data signal to a phase of a sampling clock to provide a phase error signal, a gain stage configured to apply a gain to the phase error signal to provide an amplified phase error signal, and a filter configured to filter the amplified phase error signal to provide a phase correction signal. The circuit includes a gain controller configured to adjust the gain of the gain stage in response to the phase correction signal, and a clock generator configured to provide the sampling clock based on the phase correction signal.

24 Claims, 3 Drawing Sheets

CLOCK AND DATA RECOVERY CIRCUIT HAVING GAIN CONTROL

BACKGROUND

Typically, a computer system includes a number of integrated circuits that communicate with one another to perform system applications. Often, the computer system includes one or more host controllers and one or more electronic subsystem assemblies, such as a dual in-line memory module (DIMM), a graphics card, an audio card, a facsimile card, and a modem card. To perform system functions, the host controller(s) and subsystem assemblies communicate via communication links, such as serial communication links. Serial communication links include links that implement the fully buffered DIMM (FB-DIMM) advanced memory buffer (AMB) standard, the peripheral component interconnect express (PCIe) standard, or any other suitable serial communication link system.

An AMB chip is a key device in an FB-DIMM. An AMB has two serial links, one for upstream traffic and the other for downstream traffic, and a bus to on-board memory, such as dynamic random access memory (DRAM) in the FB-DIMM. Serial data from a host controller sent through the downstream serial link (southbound) is temporarily buffered, and can then be sent to memory in the FB-DIMM. The serial data contains the address, data, and command information given to the memory, converted in the AMB, and sent to the memory bus. The AMB writes in and reads out data from the memory as instructed by the host controller. The read data is converted to serial data, and sent back to the host controller on the upstream serial link (northbound).

An AMB also performs as a repeater between FB-DIMMs on the same channel. The AMB transfers information from a primary southbound link connected to the host controller or an upper AMB to a lower AMB in the next FB-DIMM via a secondary southbound link. The AMB receives information in the lower FB-DIMM from a secondary northbound link, and after merging the information with information of its own, sends it to the upper AMB or host controller via a primary northbound link. This forms a daisy-chain among FB-DIMMs. A key attribute of the FB-DIMM channel architecture is the high-speed, serial, point-to-point connection between the host controller and FB-DIMMs on the channel. The AMB standard is based on serial differential signaling.

PCIe is also a high-speed, serial link that communicates data via differential signal pairs. A PCIe link is built around a bidirectional, serial, point-to-point connection known as a "lane". At the electrical level, each lane utilizes two unidirectional low voltage differential signaling pairs, a transmit pair and a receive pair, for a total of four data wires per lane. A connection between any two PCIe devices is known as a link, and is built up from a collection of one or more lanes. All PCIe devices minimally support single-lane (x1) links. Devices may optionally support wider links composed of x2, x4, x8, x12, x16, x32, or more lanes.

Typical chip-to-chip serial interfaces, such as a clock and data recovery circuit, are designed to meet the specifications of the system with respect to data transition density, jitter tolerance, and required tracking slew rate. The data transition density and jitter encountered by a clock and data recovery circuit depends upon the system data coding scheme and the quality of the connection channels. Based on the system data coding scheme and the quality of the connection channels, limits for the data transition density and jitter can be defined. Over these defined limits, the clock and data recovery circuit must be able to track a maximum defined amount of the phase slew rate.

If a system has a maximum data transition density and minimum untracked jitter distribution that provides an open loop gain that is too high in combination with the loop latency, the clock and data recovery circuit may show a cycle oscillation larger than the expected plus or minus one correction inherent in a digital control loop. If the cycle oscillation of the clock and data recovery circuit is larger than the target plus or minus one, then the phase error in sampling the data may be higher than expected and the feasible bit error rate of the interface undesireably higher.

For these and other reasons, there is a need for the present invention.

SUMMARY

One embodiment of the present invention provides a clock and data recovery circuit. The clock and data recovery circuit includes a phase detector configured to compare a phase of a data signal to a phase of a sampling clock to provide a phase error signal, a gain stage configured to apply a gain to the phase error signal to provide an amplified phase error signal, and a filter configured to filter the amplified phase error signal to provide a phase correction signal. The circuit includes a gain controller configured to adjust the gain of the gain stage in response to the phase correction signal, and a clock generator configured to provide the sampling clock based on the phase correction signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Fig.(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
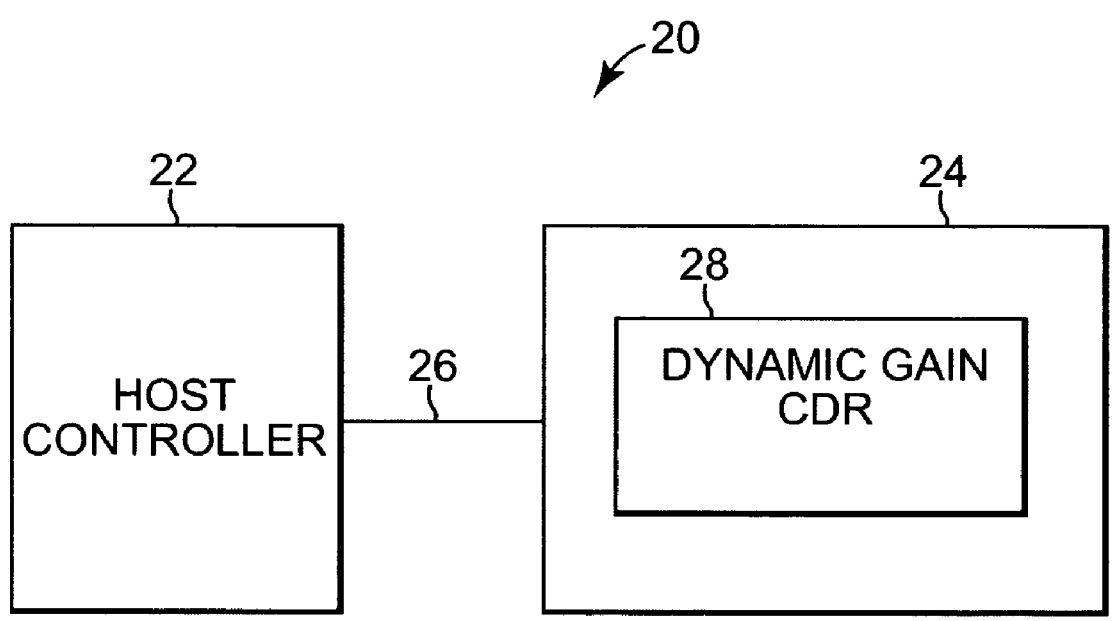
FIG. 1 is a block diagram illustrating one embodiment of a computer system according to the present invention.

FIG. 1 is a block diagram illustrating one embodiment of a computer system 20 according to the present invention. Computer system 20 includes a host controller 22 and a subsystem assembly 24. Host controller 22 is electrically coupled to subsystem assembly 24 via communications link 26. Host controller 22 controls subsystem assembly 24 via communications link 26 to provide a system function. In one embodiment, host controller 22 is a memory controller. In one embodiment, subsystem assembly 24 is an FB-DIMM and host controller 22 controls the FB-DIMM to provide a system memory function. In other embodiments, subsystem assembly 24 is any suitable subsystem assembly, such as a graphics card, an audio card, a facsimile card, or a modem card, and host controller 22 controls subsystem assembly 24 to provide the corresponding system function.

Subsystem assembly 24 includes a dynamic gain clock and data recovery (CDR) circuit 28 that is electrically coupled to host controller 22 via communications link 26. Dynamic gain CDR circuit 28 recovers a clock signal and data from a serial data stream passed to dynamic gain CDR circuit 28 through communication link 26. Dynamic gain CDR circuit 28 includes a feedback loop for adjusting the phase of a sampling clock for sampling the serial data stream. The feedback loop has an open loop gain that is adjusted based on the data transition density of the serial data stream. The data transition density is a measure of how often the serial data stream switches between a logic high "1" and a logic low "0".

The open loop gain of dynamic gain CDR circuit 28 is adjusted based on an indication of the data transition density of the serial data stream. The indication of the data transition density is the rate of phase corrections of the sampling clock of dynamic gain CDR circuit 28. A low data transition density results in a first number of phase corrections. A medium data transition density results in a second number of phase corrections greater than the first number of phase corrections. A high data transition density results in a third number of phase corrections greater than the second number of phase corrections. Each phase correction of the sampling clock of dynamic gain CDR circuit 28 adjusts the open loop gain of dynamic gain CDR circuit 28.

In response to each phase correction of the sampling clock of dynamic gain CDR circuit 28, the open loop gain is reduced to a first predetermined value. The open loop gain gradually increases from the first predetermined value to a second predetermined value unless there is another phase correction of the sampling clock, in which case the open loop gain is again reduced to the first predetermined value. The open loop gain of dynamic gain CDR circuit 28 is kept low enough to avoid instability during high data transition density and low receiver jitter and high enough during low data transition density and high receiver jitter to fulfill the slew rate requirements of the system.

The minimum setting of the gain for the system to achieve the tracking requirements defined by the system in combination with a low data transition density is specified as "Kslew." The maximum setting of the gain for the system to ensure that the feedback loop remains stable in combination with a high data transition density is specified by "Klatency." Kslew is larger than Klatency, as Kslew and Klatency are calculated under different conditions. Since a requirement of the system is to avoid excessive cycle oscillation (i.e., larger than plus or minus one), as soon as a phase correction event is generated within dynamic gain CDR circuit 28, the phase correction information is used to indicate that the open loop gain of dynamic gain CDR circuit 28 is too high.

In response to the open loop gain of dynamic gain CDR circuit 28 being too high, the Klatency gain setting is used. If the gain remained at the Klatency gain setting, then a change in the data transition density could result in dynamic gain CDR circuit 28 not being able to track the maximum defined slew rate. To prevent this situation, the gain is gradually increased to the Kslew gain setting. If at any time another phase correction event occurs, however, then the gain setting is immediately reduced back to the Klatency gain setting. The time required for the increase of the gain from the Klatency gain setting to the Kslew gain setting is set such that under the condition of minimum data transition density, dynamic gain CDR circuit 28 demonstrates the maximum slew rate requirements of the system.

Communications link 26 includes one or more differential signal pairs that communicate data between host computer 22 and subsystem assembly 24. In one embodiment, communications link 26 includes one differential signal pair. In one embodiment, communications link 26 includes multiple differential signal pairs that communicate data bi-directionally via communications link 26.

In one embodiment, subsystem assembly 24 is an FB-DIMM that is one of multiple FB-DIMMs daisy-chained to host controller 22 via communications link 26. Each of the daisy-chained FB-DIMMs includes an AMB that provides an FB-DIMM AMB serial communications link. The FB-DIMM AMB serial communications link includes data signals in the differential pairs of communications link 26. Each of the FB-DIMMs includes one or more dynamic gain CDR circuits 28 that receive a serial data stream via the differential pairs in communications link 26 and recover the clock signal and data from the serial data stream. The dynamic gain CDR circuits 28 provide the clock signal and data to circuits in the FB-DIMM subsystem assembly 24 for processing the received data.

In one embodiment, host controller 22 and subsystem assembly 24 provide a PCIe serial communications link in communications link 26. The PCIe serial communications link is an AC-coupled interface that includes data signals in the differential pairs of communications link 26. Each subsystem assembly 24 includes one or more dynamic gain CDR circuits 28 that receive a serial data stream via the differential pairs in communications link 26 and recover the clock signal and data from the serial data stream. The dynamic gain CDR circuits 28 provide the clock signal and data to circuits in subsystem assembly 24 for processing the received data. In other embodiments, host controller 22 and subsystem assembly 24 communicate via any suitable communications link that includes serial data streams.

Figure 2:
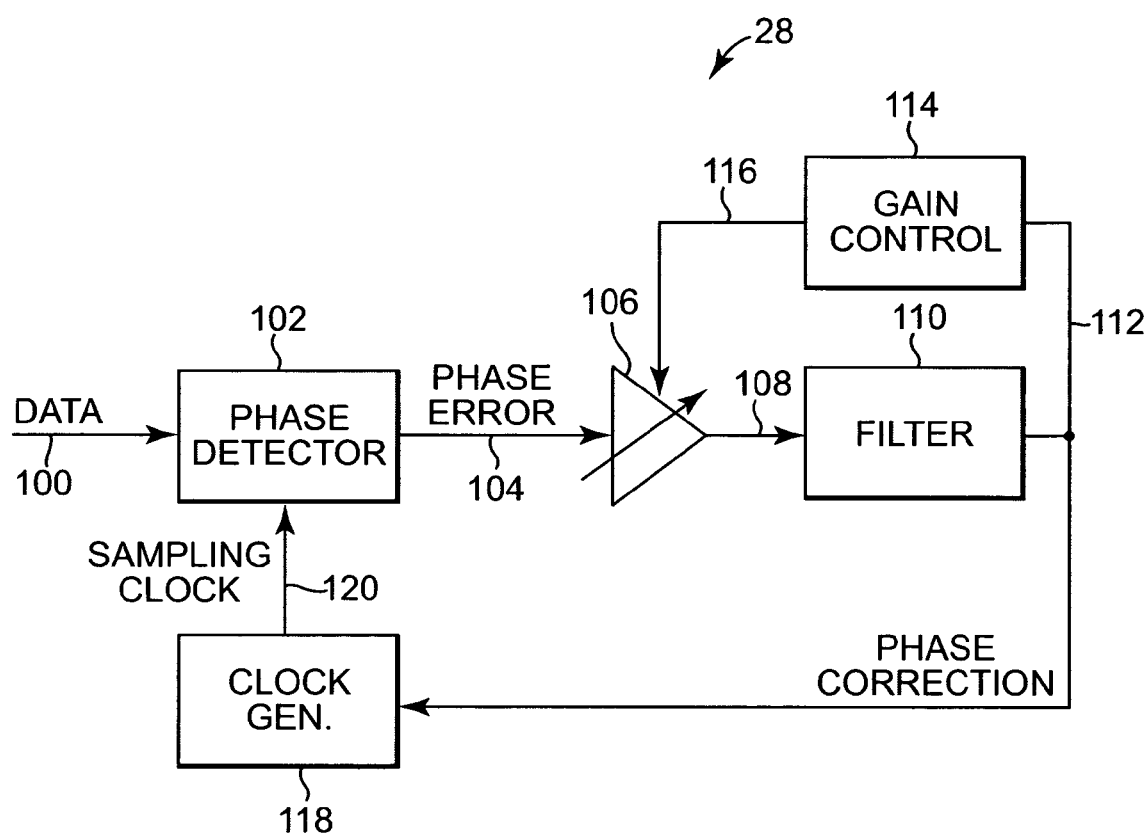
FIG. 2 is a block diagram illustrating one embodiment of a dynamic gain clock and data recovery (CDR) circuit.

FIG. 2 is a block diagram illustrating one embodiment of dynamic gain CDR circuit 28. Dynamic gain CDR circuit 28 includes phase detector 102, gain stage 106, filter 110, gain control or controller 114, and clock generator 118. A first input of phase detector 102 receives a data (DATA) signal on DATA signal path 100. In one embodiment, the DATA signal on DATA signal path 100 is passed from host controller 22 to dynamic gain CDR circuit 28 through communications link 26. An output of phase detector 102 is electrically coupled to an input of gain stage 106 through phase error (PHASE ERROR) signal path 104. An output of gain stage 106 is electrically coupled to an input of filter 110 through signal path 108. The output of filter 110 is electrically coupled to an input of gain control 114 and an input of clock generator 118 through phase correction (PHASE CORRECTION) signal path 112. The output of gain control 114 is electrically coupled to a control input of gain stage 106 through signal path 116. The output of clock generator 118 is electrically coupled to a second input of phase detector 102 through sampling clock (SAMPLING CLOCK) signal path 120.

Phase detector 102 receives the DATA signal on DATA signal path 100 and the SAMPLING CLOCK signal on SAMPLING CLOCK signal path 120 to provide the PHASE ERROR signal on PHASE ERROR signal path 104. In one embodiment, the DATA signal is in the gigabits per second range, such as 5 Gbit/sec or 10 Gbit/sec. In one embodiment, the DATA signal may include jitter. Phase detector 102 is a binary, weighted binary, or other suitable phase detector. Phase detector 102 samples the DATA signal in response to the SAMPLING CLOCK signal. Phase detector 102 also compares the phase of the DATA signal to the phase of the SAMPLING CLOCK signal to provide the PHASE ERROR signal. If the DATA signal leads the SAMPLING CLOCK signal, phase detector 102 provides a PHASE ERROR signal indicating that the DATA signal leads the SAMPLING CLOCK signal. If the DATA signal lags the SAMPLING CLOCK signal, phase detector 102 provides a PHASE ERROR signal indicating that the DATA signal lags the SAMPLING CLOCK signal.

Gain stage 106 receives the PHASE ERROR signal on PHASE ERROR signal path 104 and a gain control signal on signal path 116 to provide an amplified phase error signal on signal path 108. The gain of gain stage 106 is adjusted based on the control signal on signal path 116. Filter 110 receives the amplified phase error signal on signal path 108 to provide the PHASE CORRECTION signal on PHASE CORRECTION signal path 112. Filter 110 is a digital low pass filter or other suitable filter. In one embodiment, filter 110 passes phase correction information in the megahertz range, such as 2 MHz or 3 MHz. Gain stage 106 in combination with filter 110 provide the PHASE CORRECTION signal indicating whether the phase of the SAMPLING CLOCK signal should be advanced or delayed to align the phase of the SAMPLING CLOCK signal to the phase of the DATA signal.

Gain control 114 receives the PHASE CORRECTION signal on PHASE CORRECTION signal path 112 to provide a gain control signal on signal path 116. In response to a phase correction event as indicated by the PHASE CORRECTION signal, gain control 114 reduces the gain of gain stage 106 to the predefined Klatency gain setting, which is the maximum setting of the gain for an acceptable cycle oscillation. In response to no phase correction events as indicated by the PHASE CORRECTION signal, gain control 114 gradually increases the gain of gain stage 106 up to the predefined Kslew gain setting, which is minimum setting of the gain stage to meet the slew rate requirements of the system. If at any time a phase correction event occurs before the gain of gain stage 106 reaches the Kslew gain setting, gain control 114 again immediately reduces the gain back down to the Klatency gain setting.

Clock generator 118 receives the PHASE CORRECTION signal on PHASE CORRECTION signal path 112 to provide the SAMPLING CLOCK signal on SAMPLING CLOCK signal path 120. Clock generator 118 includes a voltage controlled oscillator (VCO) or other suitable clock generator. In response to the PHASE CORRECTION signal, clock generator 118 either advances or delays the phase of the SAMPLING CLOCK signal.

In operation, phase detector 102 samples the DATA signal and compares the phase of the DATA signal to the SAMPLING CLOCK signal to provide the PHASE ERROR signal. Gain stage 106 amplifies the PHASE ERROR signal based on the gain setting provided by gain control 114 to provide an amplified phase error signal. Filter 110 generates the PHASE CORRECTION signal in response to the amplified phase error signal to either advance, delay, or maintain the phase of the SAMPLING CLOCK signal. In response to the PHASE CORRECTION signal indicating an advance or delay of the phase of the SAMPLING CLOCK signal, the gain of gain stage 106 is reduced to the Klatency gain setting. The gain of gain stage 106 is gradually increased to the Kslew gain setting unless the PHASE CORRECTION signal indicates another advance or delay of the phase of the SAMPLING CLOCK signal. In this way, the open loop gain of dynamic gain CDR circuit 28 is kept low enough to avoid instability during high data transition density and low receiver jitter and high enough during low data transition density and high receiver jitter to fulfill the slew rate requirements for the system.

Figure 3:
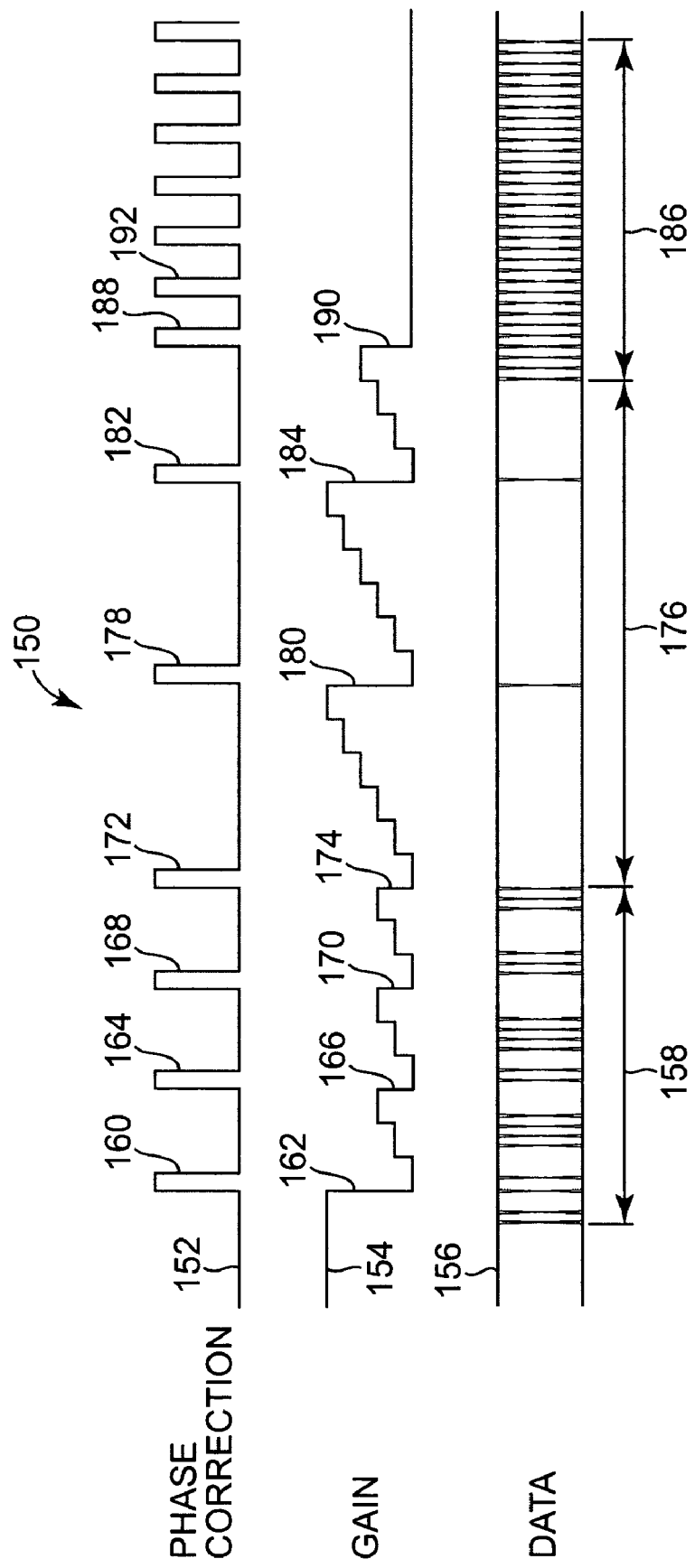
FIG. 3 is a timing diagram illustrating one embodiment of the timing of signals for the dynamic gain CDR circuit.

FIG. 3 is a timing diagram 150 illustrating one embodiment of the timing of signals for dynamic gain CDR circuit 28. Timing diagram 150 includes the PHASE CORRECTION signal 152 on PHASE CORRECTION signal path 112, gain 154 of gain stage 106 as controlled by gain control 114, and DATA signal 156 on DATA signal path 100.

In response to a medium data transition density as indicated at 158 on DATA signal 156, filter 110 issues a phase correction event at 160 on PHASE CORRECTION signal 152. In response to the phase correction event at 160, gain control 114 reduces gain 154 of gain stage 106 to the Klatency gain setting at 162. Gain 154 gradually increases until filter 110 issues another phase correction event at 164 on PHASE CORRECTION signal 152. In response to the phase correction event at 164, gain control 114 again reduces gain 154 of gain stage 106 to the Klatency gain setting at 166. Likewise, in response to phase correction events at 168 and 172, gain control 114 again reduces the gain 154 of gain stage 106 to the Klatency gain setting at 170 and 174, respectively.

In response to a low data transition density as indicated at 176 on DATA signal 156, filter 110 issues fewer phase correction events than during the medium data transition density period as indicated at 158. During the low data transition density period, gain 154 gradually increases up to the Kslew gain setting. In response to the phase correction event at 178 on PHASE CORRECTION signal 152, gain control 114 reduces gain 154 of gain stage 106 to the Klatency gain setting at 180. Gain 154 gradually increases back up to the Kslew gain setting until filter 110 issues another phase correction event at 182 on PHASE CORRECTION signal 152. In response to the phase correction event at 182, gain control 114 again reduces gain 154 of gain stage 106 to the Klatency gain setting at 184. Therefore, gain 154 increases up to the minimum gain for achieving the slew rate requirements of the system for low data transition density.

In response to a high data transition density as indicated at 186 on DATA signal 156, filter 110 issues more phase correction events than during the medium data transition density period as indicated at 158. In response to the phase correction event at 188 on PHASE CORRECTION signal 152, gain control 114 reduces gain 154 of gain stage 106 to the Klatency gain setting at 190. In response to the phase correction event at 192 and subsequent phase correction events during the high data transition density period at 186, gain 154 is maintained at the Klatency gain setting. Therefore, gain 154 is reset to the maximum possible stable value for high data transition density.

Embodiments of the present invention provide a dynamic gain CDR circuit that adjusts the open loop gain of the CDR circuit in response to phase correction events. The open loop gain is kept low enough to avoid instability during high data transition density and low receiver jitter and high enough to fulfill the slew rate requirements of the system during low data transition density and high receiver jitter. In response to each phase correction event, the open loop gain is reduced to the Klatency gain setting. The gain is gradually increased up to the Kslew gain setting unless another phase correction event occurs. In this way, the CDR circuit controls the open loop gain to avoid instability and yet has enough gain to track the data and meet the minimum data transition density and maximum slew rate requirements of the system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A clock and data recovery circuit comprising:
   a phase detector configured to compare a phase of a data signal to a phase of a sampling clock to provide a phase error signal;
   a gain stage configured to apply a gain to the phase error signal to provide an amplified phase error signal;
   a filter configured to filter the amplified phase error signal to provide a phase correction signal;
   a gain controller configured to adjust the gain of the gain stage in response to the phase correction signal; and
   a clock generator configured to provide the sampling clock based on the phase correction signal.

2. The circuit of claim 1, wherein the gain controller is configured to reduce the gain to a predetermined value in response to a phase correction event indicated by the phase correction signal.

3. The circuit of claim 2, wherein the predetermined value comprises a maximum value for circuit stability.

4. The circuit of claim 1, wherein the gain controller is configured to gradually increase the gain to a predetermined value in response to no phase correction events as indicated by the phase correction signal.

5. The circuit of claim 4, wherein the predetermined value comprises a minimum value to meet slew rate requirements for the circuit.

6. A clock and data recovery circuit comprising:
   means for determining a phase error between a data signal and a sampling clock to provide a phase error signal;
   means for applying a gain to the phase error signal to provide an amplified phase error signal;
   means for filtering the amplified phase error signal to provide a phase correction signal;
   means for adjusting the gain in response to the phase correction signal; and
   means for providing the sampling clock based on the phase correction signal.

7. The circuit of claim 6, wherein the means for adjusting the gain comprises means for reducing the gain to a maximum value for maintaining stability in response to a correction event as indicated by the phase correction signal.

8. The circuit of claim 6, wherein the means for adjusting the gain comprises means for gradually increasing the gain to a minimum value for achieving a slew rate requirement of the circuit in response to no change in the phase correction signal.

9. The circuit of claim 6, wherein the means for filtering comprises means for digitally low pass filtering.

10. A method for recovering a clock signal and data, the method comprising:
    determining via a phase detector a phase difference between a data signal and a sampling clock to provide a phase error signal;
    applying via a gain stage a gain to the phase error signal to provide an amplified phase error signal;
    filtering via a filter the amplified phase error signal to provide a phase correction signal;
    adjusting the gain via a gain controller in response to the phase correction signal; and
    providing via a clock generator the sampling clock based on the phase correction signal.

11. The method of claim 10, wherein adjusting the gain comprises reducing the gain to a predetermined value in response to a phase correction event as indicated by the phase correction signal.

12. The method of claim 10, wherein adjusting the gain comprises gradually increasing the gain to a predetermined value in response to no phase correction events as indicated by the phase correction signal.

13. The method of claim 10, wherein filtering the amplified phase error signal comprises digitally low pass filtering the amplified phase error signal.

14. The method of claim 10, wherein adjusting the gain comprises reducing the gain to maintain stability during high data transition density and increasing the gain to fulfill slew rate requirements during low data transition density.

15. A method for recovering a clock signal and data, the method comprising:
    providing a clock and data recovery circuit having a gain stage and a gain controller;
    reducing the gain of the gain stage via the gain controller to a first predetermined value in response to a phase correction event received by the gain controller; and
    gradually increasing the gain of the gain stage via the gain controller to a second predetermined value in response to the gain controller not receiving any phase correction events.

16. The method of claim 15, wherein reducing the gain of the gain stage comprises reducing the gain of the gain stage to a maximum gain for circuit stability.

17. The method of claim 15, wherein reducing the gain of the gain stage comprises reducing the gain of the gain stage to a maximum gain for circuit stability during high data transition density.

18. The method of claim 15, wherein gradually increasing the gain of the gain stage comprises gradually increasing the gain of the gain stage to a minimum gain to meet slew rate requirements.

19. The method of claim 15 wherein gradually increasing the gain of the gain stage comprises gradually increasing the gain of the gain stage to a minimum gain to meet slew rate requirements during low data transition density.

20. An integrated circuit comprising:
    a phase detector configured to detect a phase error between a first signal and a clock signal to provide a phase error signal;
    a gain stage configured to apply a gain to the phase error signal to provide an amplified phase error signal;
    a filter configured to filter the amplified phase error signal to provide a phase correction signal;
    a gain controller configured to adjust the gain of the gain stage in response to the phase correction signal; and
    a clock generator configured to provide the clock signal based on the phase correction signal.

21. The integrated circuit of claim 20, wherein the gain controller is configured to reduce the gain to a predetermined value in response to a phase correction event as indicated by the phase correction signal.

22. The integrated circuit of claim 20, wherein the gain controller is configured to gradually increase the gain to a predetermined value in response to no phase correction events as indicated by the phase correction signal.

23. The integrated circuit of claim 20, wherein the phase detector comprises a binary phase detector.

24. The integrated circuit of claim 20, wherein the filter comprises a digital low pass filter.

* * * * *